(12) United States Patent
Atanus et al.

(10) Patent No.: US 6,636,101 B2
(45) Date of Patent: Oct. 21, 2003

(54) CONTROL ARRANGEMENT AND METHOD FOR ELECTRONIC DEVICE

(75) Inventors: Ronald D. Atanus, Mt. Prospect, IL (US); Gregory C. Mears, Chicago, IL (US); Richard P. Mikosz, Hickory Hills, IL (US); Raymond P. O'Leary, Evanston, IL (US); Michael G. Ennis, Evanston, IL (US); Joseph W. Ruta, Arlington Heights, IL (US)

(73) Assignee: S&C Electric Co., Chicago, IL (US)

( * ) Notice: Subject to any disclaimer, the term of this patent is extended or adjusted under 35 U.S.C. 154(b) by 0 days.

(21) Appl. No.: 10/036,659

(22) Filed: Dec. 21, 2001

(65) Prior Publication Data

US 2002/0060599 A1 May 23, 2002

Related U.S. Application Data

(62) Division of application No. 09/552,901, filed on Apr. 20, 2000.
(60) Provisional application No. 60/130,942, filed on Apr. 26, 1999.

(51) Int. Cl.[7] ................................................. G05F 1/00
(52) U.S. Cl. ........................ 327/519; 327/387; 327/520
(58) Field of Search .......................... 327/519, 108.112, 327/387, 388, 389, 391, 427, 428, 429, 520, 518; 307/112, 125, 126

(56) References Cited

U.S. PATENT DOCUMENTS

| | | | | |
|---|---|---|---|---|
| 4,634,903 A | * | 1/1987 | Montorfano | 327/432 |
| 4,811,163 A | * | 3/1989 | Fletcher | 361/8 |
| 5,386,147 A | * | 1/1995 | Bonneau et al. | 307/64 |
| 5,408,150 A | * | 4/1995 | Wilcox | 327/108 |
| 5,555,182 A | * | 9/1996 | Galm | 702/69 |
| 5,635,772 A | * | 6/1997 | Lagree et al. | 307/64 |
| 5,644,175 A | | 7/1997 | Galm | |
| 5,808,378 A | * | 9/1998 | O'Leary | 307/87 |
| 5,814,904 A | | 9/1998 | Galm | |
| 5,929,665 A | * | 7/1999 | Ichikawa et al. | 327/109 |
| 5,977,737 A | * | 11/1999 | Labriola, II | 318/599 |
| 6,011,327 A | * | 1/2000 | Cook et al. | 307/125 |
| 6,134,124 A | * | 10/2000 | Jungreis et al. | 363/34 |
| 6,331,798 B1 | * | 12/2001 | O'Leary et al. | 327/470 |
| 6,504,696 B1 | * | 1/2003 | Mikosz et al. | 361/93.8 |

* cited by examiner

Primary Examiner—Timothy P. Callahan
Assistant Examiner—Hai L. Nguyen
(74) Attorney, Agent, or Firm—James V. Lapacek

(57) ABSTRACT

A control arrangement and method is provided for electronic devices in which an electronic switch is maintained in a conducting state at all times other than when it is desired to render the electronic switch nonconducting. In a specific embodiment, a latched control signal is utilized which is changed by the receipt of a momentary signal to change the conducting state of the electronic switch. For example, according to one specific arrangement, the momentary signal is a secure, complex signal such that appropriate decoding and detection of the proper signal is required to change the conducting state of the electronic switch.

7 Claims, 3 Drawing Sheets

CONTROL ARRANGEMENT AND METHOD FOR ELECTRONIC DEVICE

This application is a division of Ser. No. 09/552,901 filed Apr. 20, 2000 which claims benefit of provisional No. 60/130,942 filed Apr. 26, 1999.

BACKGROUND OF THE INVENTION

1. Field of the Invention

The present invention relates generally to the control of electronic devices and more particularly to a control arrangement and method that controls the conductive state of an electronic device such that the normal state is conductive and a predetermined control signal is required to render the power electronics device nonconductive.

2. Discussion of the Related Art

Various electronic systems are known where devices are controlled between conductive and nonconductive states. In power electronic systems arranged as source-transfer switches, continuous power to a load is supplied by transferring the supply of the load from one source to another when undesirable characteristics are sensed in the source currently supplying the load. For example, the arrangement in U.S. Pat. No. 5,808,378 provides desirable control features for the solid-state switches that are selectively rendered conductive to supply current to a load from one of two or more sources. Undesirable current flow between sources is avoided and transfer delays are minimized. In U.S. Pat. Nos. 5,644,175 and 5,814,904, when a transfer is desired, current through the conducting solid-state switch is sensed twice before signals are removed from the conducting switch and applied to another solid-state switch to provide current through an alternate source. The arrangement in U.S. Pat. No. 4,811,163 provides solid-state switches across the main power contacts of automatic bus transfer equipment. The solid-state switch is rendered conductive before its respective main contact is closed and a timer circuit maintains the solid-state switch conductive for a predetermined time period selected to ensure that the main contact will be closed while the solid-state switch is still conductive.

The controls for the power electronic devices utilized in these systems are subject to noise that may effect the conducting state of the switch by erroneously turning it on or off. Thus, while these arrangements may be useful and generally satisfactory for their intended purposes, they are prone to erroneously changing the conductive state of switches.

SUMMARY OF THE INVENTION

Accordingly it is a principal object of the present invention to provide a control arrangement for electronic devices in which an electronic switch is maintained in a conducting state at all times other than when it is desired to render the electronic switch nonconducting.

It is another object to provide a control method and arrangement to control the conducting status of a power electronic switch via a latched control signal, such that the appropriate receipt of a secure, complex signal is required to change the conducting state of the power electronic switch.

It is a further object of the present invention to latch the conductive state of a switch and toggle the latch to render the switch nonconductive via the decoding of a complex encoded momentary signal.

It is yet another object of the present invention to provide a control that maintains a power electronic switch in a conducting state at all times other than when an active signal is received to turn off the power electronic switch.

These and other objects of the present invention are efficiently achieved by a control arrangement for electronic devices in which an electronic switch is maintained in a conducting state at all times other than when it is desired to render the electronic switch nonconducting. In a specific embodiment, a latched control signal is utilized which is changed by the receipt of a momentary signal to change the conducting state of the electronic switch. For example, according to one specific arrangement, the momentary signal is a secure, complex signal such that appropriate decoding and detection of the proper signal is required to change the conducting state of the electronic switch.

BRIEF DESCRIPTION OF THE DRAWING

The invention, both as to its organization and method of operation, together with further objects and advantages thereof, will best be understood by reference to the specification taken in conjunction with the accompanying drawing in which like references refer to like elements and in which.

DETAILED DESCRIPTION

Figure 1:
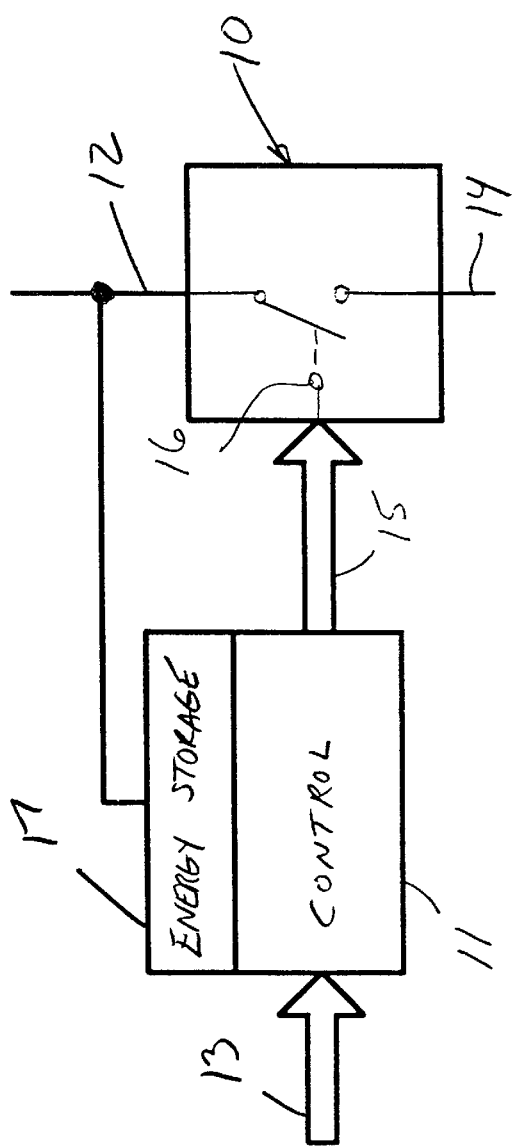
FIGS. 1–4 are block diagram representations of four embodiments of four respective control arrangements of the present invention.

Referring now to FIG. 1, a control arrangement and method according to the present invention is utilized to control a power electronic device, e.g. an illustrative electronic switch 10, that includes a main path between lines 12 and 14 that is controlled between on and off states, corresponding to respective conductive and nonconductive states, via a control connection at 16. In specific examples, the electronic switch 10 is an SCR, thyristor, TRIAC, IGBT, inverse-parallel connected SCR's, or other actively controlled devices. A control stage 11 provides control signals at 15, e.g. "ON" and "OFF" state signals, to the control connection 16 to control the conductive state of the electronic switch 10. In a specific arrangement the control 11 is arranged to maintain the electronic switch 10 in the conductive state at all times other than when a control signal is generated at 15 to turn off the electronic switch 10, e.g. the deliberate generation by the control 11 of an active OFF signal at 15 is required to turn off the electronic switch 10. For example, with an AC waveform on line 12, the control 11 is effective to condition the electronic switch 10 to the conductive state each half cycle of the AC waveform when no OFF signal is generated. In a specific arrangement, the control 11 is responsive to a power-up input signal at 13 to continuously provide at all times thereafter an ON signal to the electronic switch 10 unless conditions are sensed that define a desired OFF state signal be sent at 15 by the control 11 to turn off the electronic switch 10. In a specific arrangement, an energy storage stage 17 is provided that stores energy from the line 12 and provides operating energy to the control 11. Thus, the control 11 is capable of providing continuous control to the electronic switch 10 independent of the present, momentary state of the line 12, e.g. to maintain the electronic switch 10 in the conductive state.

Figure 2:
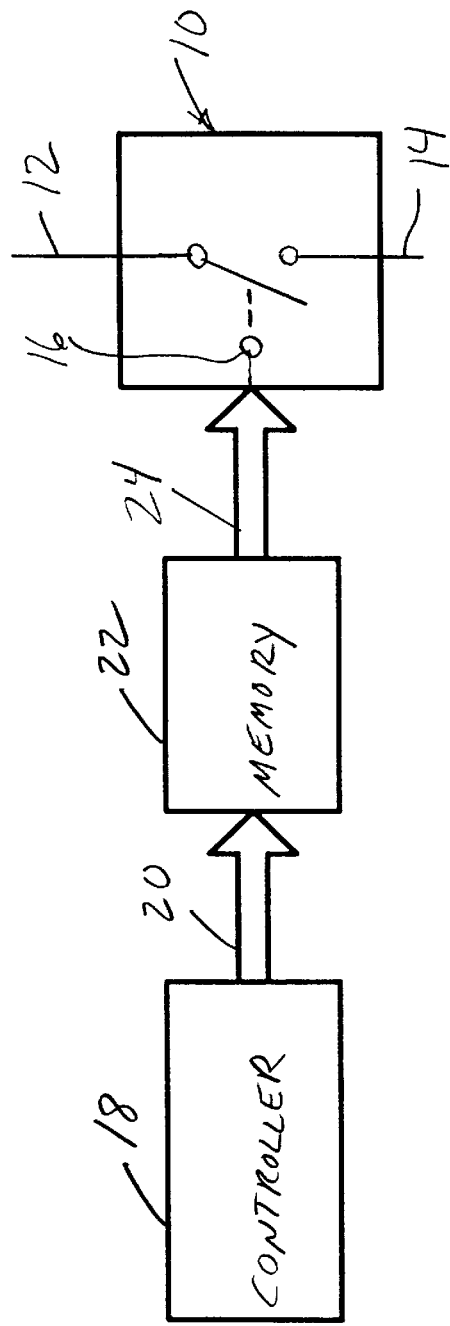

In accordance with other aspects of the present invention and with reference now to FIG. 2, an illustrative controller 18 provides control signals at 20 to a memory stage 22. In a specific arrangement, the control signals at 20 represent an "ON" or "OFF" command and are generated on a momentary basis, i.e. short duration, whenever it is desired to change the conductive state of the electronic switch 10. The memory stage 22 responds to the control signals at 20 by providing a latched output at 24 that changes output state only when a control signal at 20 is received which represents a desired change in the conductive state of the electronic switch 10. The latched output signal at 24 is provided to the control connection at 16 to control the conductive state of the electronic switch 10. Accordingly, when it is desired to change the conductive state of the electronic switch 10, the controller 18 issues a control signal at 20 whereupon the state of the latched output signal at 24 is changed and the conductive state of the electronic switch 10 is changed. For example, in one specific arrangement, assuming that the electronic switch 10 is conducting and it is desired to turn off the electronic switch 10, a predetermined OFF signal is provided at 20. In response to the OFF signal at 20, the memory stage 22 changes the state of the latched output signal at 24 to render the electronic switch 10 non-conducting. In one specific embodiment, the ON and OFF control signals at 20 are distinct predetermined data words on a data bus. In another specific arrangement, the control signals at 20 include a separate control line for each of the ON and OFF signals. In yet another specific arrangement, the control signal at 20 is a momentary signal for a change of the conductive state which can be characterized as toggling the memory stage 22 whenever it is desired to change the conductive state of the electronic switch 10.

Figure 3:
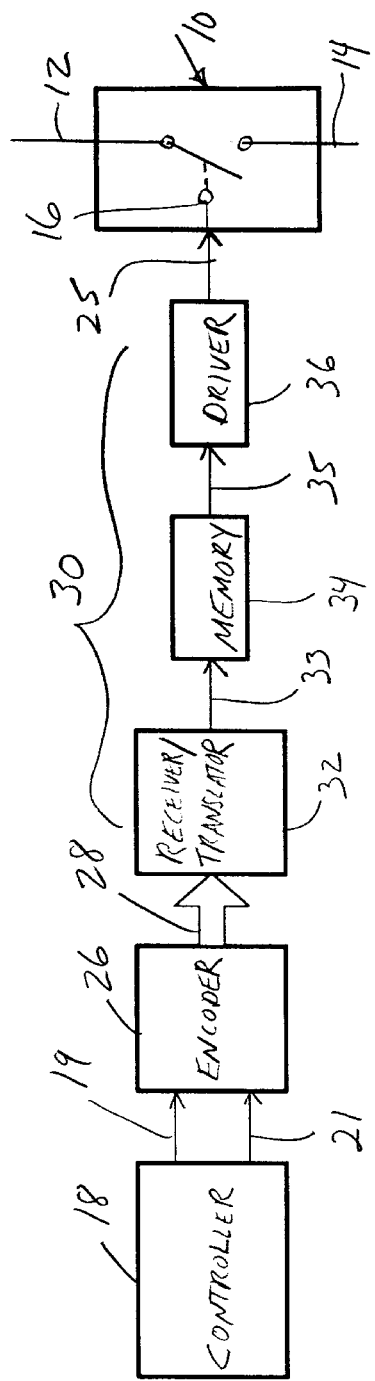

Considering now an illustrative embodiment of the control arrangement and method of the present invention for environments where the electronic switch 10 is located remotely and separated from the controller 18 and referring now to FIG. 3, the controller 18 provides an ON signal at 19 and an OFF signal at 21 to an encoder stage 26. The encoder stage 26 encodes the ON/OFF signals at 19, 21 and communicates over a communications link 28 to a decoder arrangement generally referred to at 30. The decoder arrangement 30 provides latched output signals at 25 to control the electronic switch 10. In response to the signals at 19, 21, the encoder stage 26 provides a predetermined ON or OFF encoded signal over the communications link 28 to the decoder arrangement 30. The decoder arrangement 30 decodes the encoded signal received from the communications link 28 and changes the state of the latched output signal at 25 in accordance with this decoded signal. For example, in a specific arrangement, if the decoded signal corresponds to an ON state, the signal at 25 is changed to or maintained at the ON state to the electronic switch 10. Correspondingly, if the decoded signal in the decoder arrangement 25 corresponds to an OFF state, the signal at 25 is changed to or maintained at the OFF state to the electronic switch 10. In a specific arrangement, the ON and OFF signals at 19, 21 are momentary pulse signals and the encoded signal is a pulse train including a predetermined different number of pulses for an OFF signal and an ON signal over the communications link 28. The communications link 28 in various implementations is provided by a dielectric medium such as fiber optics, infrared or various other communications media. The decoder stage 30 determines an ON or OFF signal based on the pulse count and appropriately changes the latched output state at 25 to correspond to the decoded signal at. In a specific illustrative example as shown in FIG. 3, the decoder arrangement 30 includes a receiver/translator stage 32, a memory stage 34 and a driver stage 36. The receiver/translator stage 32 responds to the encoded signals on the communications link 28 and provides appropriate control to change the state of the memory stage 34 via a signal path 33. The memory stage 34 provides a latched output at 35 to control the driver stage 36. Such an arrangement is especially useful where the location and environment of the electronic switch 10 is a high noise environment such as where the electronic switch 10 operates at medium voltages. In such embodiments, the communications link 28 is an isolating link such as provided by fiber optics, infrared, pulse transformers etc. as known in the art. Additionally, in a preferred embodiment, the driver stage 36 includes isolation between the input at 35 and the output at 25 to the electronic switch 10. In a specific implementation, the driver stage 36 is arranged to provide gating signals to the electronic switch 10 at 25 each half cycle of an AC waveform as long as the latching output at 35 corresponds to the ON state.

Figure 4:
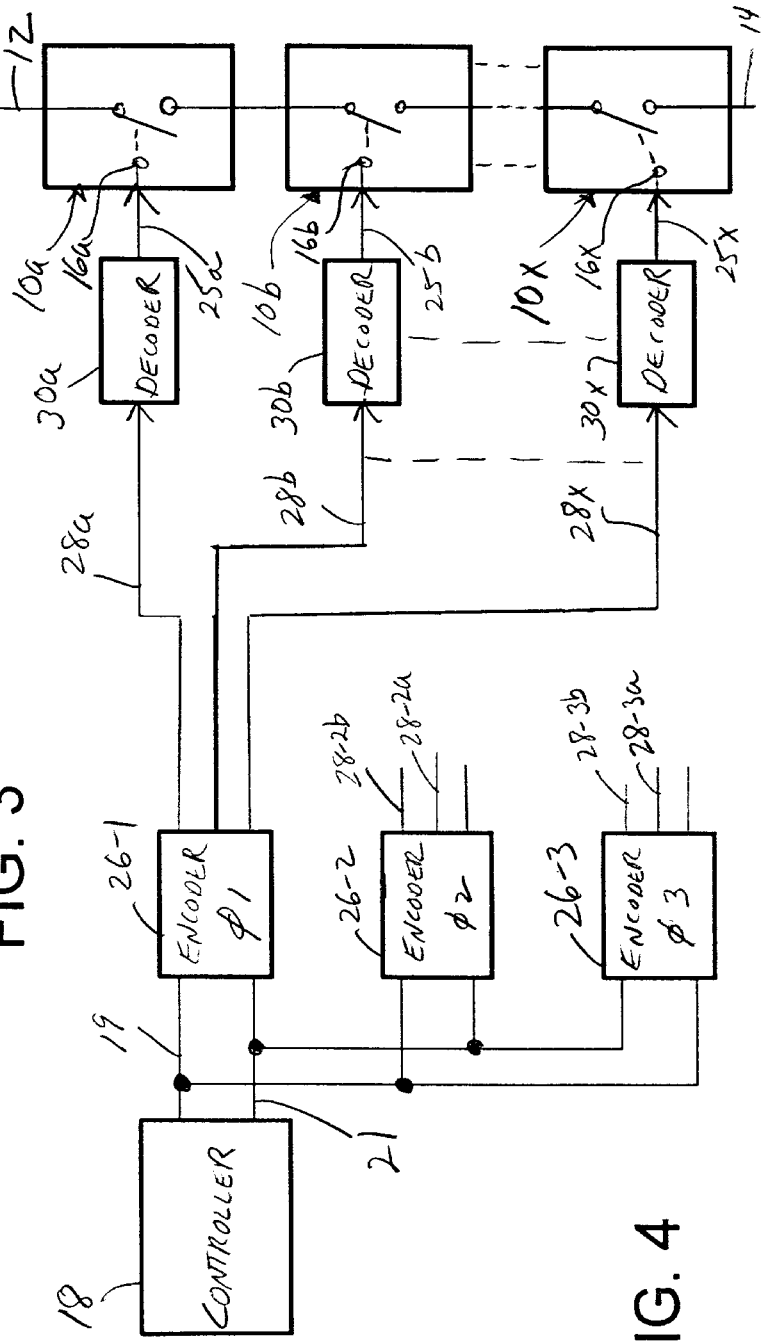

Considering now another illustrative embodiment of the present invention and referring now additionally to FIG. 4, the illustrative electronic switch 10 is implemented by a plurality of series-connected electronic switch stages, e.g. as illustrated in FIG. 4 by first and second stages 10a and 10b, and by a last stage 10x. For each of the series-connected electronic switch stages 10a to 10x, a respective decoder stage 30 is provided, e.g. as represented by the respective decoder stages 30a, 30b and 30x,. The decoder stages 30a to 30x receive signals over respective links 28a to 28x from the common encoder stage 26 and provide the respective latched outputs 25a, 25b and 25x. In this manner, the electronic switch 10 with the plurality of series-connected stages is controlled by the controller 18 and the encoder stage 26. Where a multi-phase power electronic system is to be controlled, the electronic switch 10 provides one pole of the system for controlling conduction between the lines 12, 14 of one phase of the system. In such an arrangement, an additional encoder stage 26 is provided for each additional phase, e.g. 26-2 and 26-3 which are controlled via the signal lines 19, 21 from the controller 18. In a specific arrangement, the decoder stages 30a-30x are arranged to provide an ON signal at respective outputs 25a–25x whenever no control signal is received from the encoder 26-1 over the links 28a–28x respectively.

Figure 5:
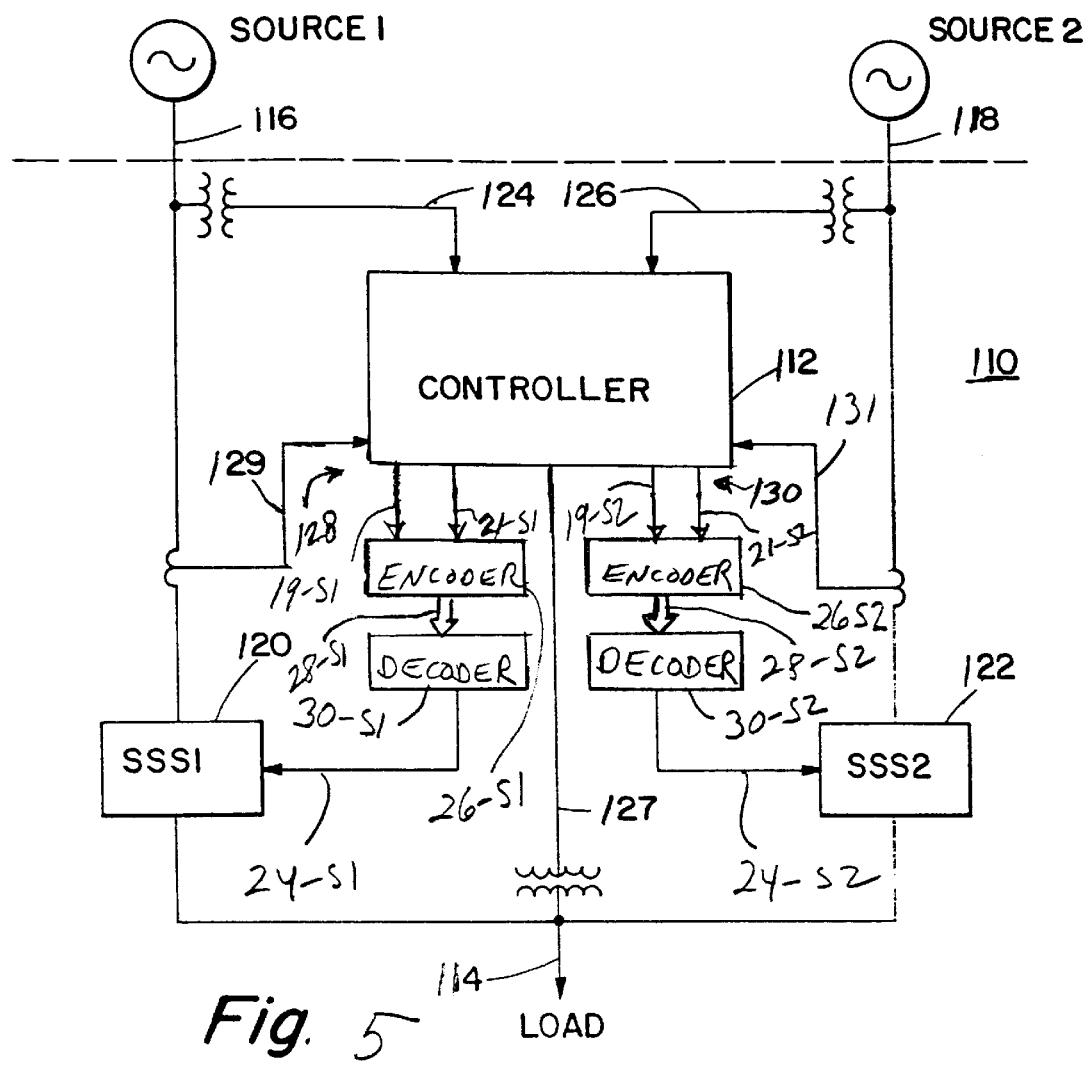
FIG. 5 is a block diagram representation of a high-speed source-transfer switching system utilizing the control arrangement of the present invention.

Referring now additionally to FIG. 5, a power electronic system configured as a high-speed source-transfer switching system (HSSTSS) 110 includes a controller stage 112 to provide an illustrative embodiment of the control arrangement and method of the present invention of FIGS. 1–4. The HSSTSS 110 supplies a load at 114 with an alternating-current waveform via either a first AC source at 116 or a second AC source at 118. The first and second AC sources 116 and 118 and the load at 114 as provided in an electrical power distribution system are typically multi-phase circuits which are represented in FIG. 5 by a one-line diagram, i.e. one phase of the multi-phase system. The HSSTSS 110 includes a first solid-state switch, SSS1, 120 and a second solid-state switch, SSS2, 122. The HSSTSS 110 via the controller stage 112 controls either SSS1 to supply the load at 114 via the first source 116 or controls SSS2 to supply the load at 114 via the second source 118.

The controller stage 112 samples the voltage waveforms of each source 116, 118, e.g. via respective sensing inputs at 124, 126 to detect when transfer between the sources is desirable, e.g. sensing disturbances such as outages and momentary interruptions as well as voltage sags and swells, all based on the source supplying the load being above or below preset levels. The controller stage 112 provides appropriate control signals at 128, 130 to control the operation of each respective solid-state switch, SSS1 120 and SSS2 122. For example, assume that SSS1 120 is turned on by the controller stage 112 via signals at 128 so as to be conductive and supply the load at 114. If the controller stage 112 via the sensing input 124 senses that the voltage of the first source at 116 is exhibiting undesirable characteristics, the controller stage 112 via the control signals at 128, 130 turns off SSS1 and turns on SSS2 so as to transfer the supply of the load at 114 from the first source at 116 to the second source at 118. As used herein, the term "incoming" is used to describe the source and the SSS that will be turned on to supply the load (e.g. the second source at 118 and SSS2 in the illustrative example), and the term "outgoing" is used to describe the source and the SSS that is being turned off (e.g. the first source at 116 and SSS1 in the illustrative example).

Figure 6:
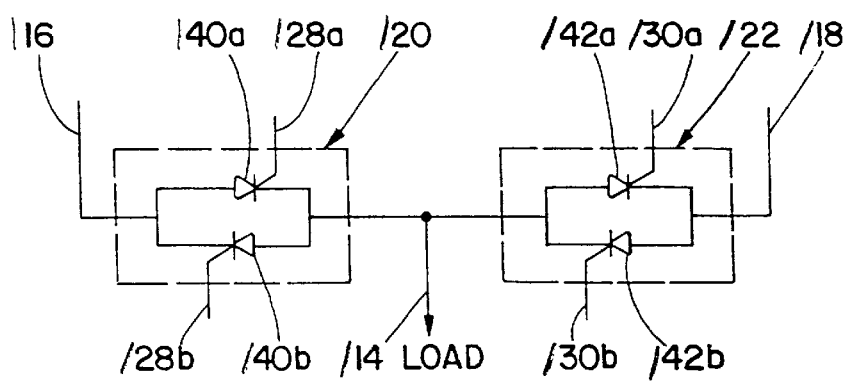
FIG. 6 is a one-line, diagrammatic representation of portions of a solid-state switch of FIG. 5.

Referring now to FIG. 6, each of the solid-state switches SSS1 and SSS2 includes one or more arrays of back-to-back (inverse-parallel) connected thyristors, e.g. 140a and 140b for SSS1 and 142a and 142b for SSS2. In illustrative implementations, each array of thyristors is rated in the range of 2–10 kv. To provide operation in medium voltage systems, e.g. operating in the range of 2–34.5 kv, one or more of such thyristors SSS1 and SSS2 are connected in series for each phase of the sources, e.g. a plurality of such thyristors being referred to as a stack. Thus, while the term thyristor is used for the solid-state switches SSS1, 140 and SSS2, 142, in specific implementations at medium voltages, this commonly refers to a thyristor stack.

Considering now operation of the control arrangement and method of the present invention, transfer of the load at 114 from one source to the other, e.g. the first source at 116 to the second source at 118, is generally accomplished by removing the gating signals at 128a, 128b to shut off SSS1 and starting the gating signals at 130a, 130b to turn on SSS2. Thus, the first source at 116 ceases to supply the load at 114 and the second source at 118 begins to supply the load at 114. For desirable transfer control, the controller 112 is provided with additional sensing inputs, e.g. the incoming source-voltage differential is determined by the load voltage at 114 as sensed via a sensing input 127 or by the differential of the source voltages sensed at 124, 126, and the current to SSS1 and SSS2 being sensed via respective current sensing inputs at 129 and 131.

In accordance with important aspects of the present invention, the various control arrangements illustrated in FIGS. 1–4 may be utilized by the controller stage 112 to control the solid-state switches SSS1 and SSS2. For example, as illustrated in FIG. 5, the signals referred to at 128 and 130 are utilized by the controller stage 112 to issue ON/OFF commands to achieve appropriate control of the switches SSS1 and SSS2. Specifically, the signals at 128 include the signals 19-S1 and 21-S1, and the signals at 130 include the signals 19-S2 and 21-S2. Also as shown, the encoders 26, the links 28 and decoders 30 are provided for each source, denoted by 26-S1, 28-S1 and 30-S1 for Source 1 and 26-S2, 28-S2 and 30-S2 for Source 2. Thus, the decoder 30-S1 controls the switch SSS1 over control line 24-S1 and the decoder 30-S2 controls the switch SSS2 over the control line 24-S2. When the controller 112 determines that a transfer is desired, e.g. from Source 1 to Source 2, an OFF signal is transmitted at 21-S1 and an ON signal is transmitted at 19-S2.

While there have been illustrated and described various embodiments of the present invention, it will be apparent that various changes and modifications will occur to those skilled in the art. For example, while an implementation for a source-transfer system was used for illustrative purposes, it should be realized that the present invention is applicable to other medium-voltage applications such as voltage boosters, dynamic voltage restorers, load balancers, etc. and also to other bus configurations such as split-bus configurations etc. Accordingly, it is intended in the appended claims to cover all such changes and modifications that fall within the true spirit and scope of the present invention.

What is claimed is:

1. A control arrangement for a source-transfer switching system of the type that includes first and second solid-state switches having respective first and second control inputs, input source connections and output connections, the output connections being connected to a common load circuit connection, the control arrangement comprising:
    transfer control means for controlling the first and second solid-state switches via the first and second control inputs so as to selectively supply the common load circuit connection via either the first or second solid-state switch, said transfer control means further comprising first control means for providing a switch control signal for each of said first and second solid-state switches to selectively change the conductive state of either the first or second solid-state switch and switch control means responsive to said switch control signals for controlling the conductive state of the first and second solid-state switches via the first and second control inputs and maintaining the first and second solid-state switches in the conductive state via continuously providing a conductive state signal until the receipt of said switch control signal to render the first or second solid-state switch nonconductive whereby the conductive state of the first or second solid-state switch is maintained in the conductive state independent of the input source connections, said control means further providing predetermined on and off switch control signals for each of said first and second solid-state switches.

2. The control arrangement of claim 1 wherein said switch control means comprises latch means for maintaining the switch control input in a predetermined state until the receipt of said switch control signal.

3. The control arrangement of claim 1 wherein said switch control signal is a momentary signal and said switch control means comprises memory means having a memory state that is either on or off and being responsive to said momentary signal for changing said memory state.

4. The control arrangement of claim 1 wherein said predetermined on and off switch control signals are provided on a common signal path.

5. The control arrangement of claim 4 wherein said predetermined on signal is encoded as a first predetermined number of pulses and said predetermined off signal is encoded as a second predetermined number of pulses.

6. A control arrangement for a source-transfer switching system of the type that includes first and second solid-state switches having respective first and second control inputs, input source connections and output connections, the output connections being connected to a common load circuit connection, the control arrangement comprising:
    transfer control means for controlling the first and second solid-state switches via the first and second control inputs so as to selectively supply the common load circuit connection via either the first or second solid-state switch, said transfer control means further comprising first control means for providing a switch control signal to selectively change the conductive state of either the first or second solid-state switch and switch control means responsive to said switch control signal for controlling the conductive state of the first and second solid-state switches via the first and second control inputs and maintaining the first and second solid-state switches in the conductive state via continuously providing a conductive state signal until the receipt of said switch control signal to render the first or second solid-state switch nonconductive whereby the conductive state of the first or second solid-state switch is maintained in the conductive state independent of the input source connections, said first control means further comprising means for encoding said switch control signal, means for communicating said switch control signal and means for decoding said switch control signal.

7. The control arrangement of claim 6 wherein said encoding means encodes said switch control signal as a predetermined succession of pulses.

* * * * *